US009689940B2

United States Patent
Biber et al.

(10) Patent No.: US 9,689,940 B2
(45) Date of Patent: Jun. 27, 2017

(54) LOCAL COIL SYSTEM, TRANSMITTING DEVICE, MAGNETIC RESONANCE SYSTEM AND METHOD FOR THE WIRELESS TRANSFER OF ENERGY TO A LOCAL COIL SYSTEM

(75) Inventors: Stephan Biber, Erlangen/Frauenaurach (DE); Jürgen Nistler, Erlangen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 870 days.

(21) Appl. No.: 13/487,174

(22) Filed: Jun. 2, 2012

(65) Prior Publication Data

US 2012/0313645 A1 Dec. 13, 2012

(30) Foreign Application Priority Data

Jun. 3, 2011 (DE) .......................... 10 2011 076 918

(51) Int. Cl.
*G01R 33/36* (2006.01)
*G01R 33/3415* (2006.01)

(52) U.S. Cl.
CPC ...... *G01R 33/3692* (2013.01); *G01R 33/3415* (2013.01)

(58) Field of Classification Search
CPC .................. G01R 33/3692; G01R 33/3415
See application file for complete search history.

(56) References Cited

U.S. PATENT DOCUMENTS

| 4,475,084 A | * | 10/1984 | Moore | ................. | G01N 24/008 |
| | | | | | 324/307 |
| 4,680,547 A | * | 7/1987 | Leue | ................... | G01R 33/385 |
| | | | | | 324/309 |
| 4,689,563 A | * | 8/1987 | Bottomley | ......... | G01R 33/3607 |
| | | | | | 324/309 |
| 4,689,564 A | * | 8/1987 | Leue | ...................... | G01R 33/54 |
| | | | | | 324/309 |
| 4,694,254 A | * | 9/1987 | Vatis | ................. | G01R 33/3607 |
| | | | | | 324/309 |

(Continued)

FOREIGN PATENT DOCUMENTS

| CN | 1409125 A | 4/2003 |
| CN | 1430067 A | 7/2003 |

(Continued)

OTHER PUBLICATIONS

German Office Action dated Mar. 2, 2012 for corresponding German Patent Application No. DE 10 2011 076 918.8 with English translation.

(Continued)

*Primary Examiner* — Dixomara Vargas
(74) *Attorney, Agent, or Firm* — Lempia Summerfield Katz LLC

(57) ABSTRACT

A local coil system for a magnetic resonance system including at least one local coil for capturing magnetic resonance (MR) signals and at least one energy receiving antenna for inductively receiving energy for the local coil system from a temporally varying magnetic field is provided. The at least one energy receiving antenna is or may be tuned to an energy transfer frequency that is lower than a Larmor frequency of the MR signals to be captured and higher than approximately 20 kHz.

18 Claims, 8 Drawing Sheets

(56) References Cited

U.S. PATENT DOCUMENTS

| | | | |
|---|---|---|---|
| 5,929,639 A * | 7/1999 | Doty | 324/318 |
| 6,137,291 A * | 10/2000 | Szumowski et al. | 324/318 |
| 6,297,637 B1 | 10/2001 | Feld et al. | |
| 6,791,322 B2 * | 9/2004 | Vester | 324/309 |
| 6,906,520 B2 | 6/2005 | Heid et al. | |
| 7,417,433 B2 | 8/2008 | Heid et al. | |
| 7,592,813 B2 | 9/2009 | Boskamp et al. | |
| 8,269,499 B2 * | 9/2012 | Hamamura | G01R 33/3642 324/318 |
| 8,324,897 B2 * | 12/2012 | Hornung | G01R 33/3621 324/308 |
| 2003/0076105 A1 | 4/2003 | Feld et al. | |
| 2003/0078004 A1 | 4/2003 | Vester | |
| 2005/0174201 A1 | 8/2005 | Luong et al. | |
| 2009/0237079 A1 | 9/2009 | Van Helvoort et al. | |
| 2010/0308826 A1 | 12/2010 | Saes et al. | |

FOREIGN PATENT DOCUMENTS

| | | |
|---|---|---|
| CN | 1918479 A | 2/2007 |
| CN | 101088021 A | 12/2007 |
| CN | 101903791 A | 12/2010 |
| WO | WO 2006/067682 A2 | 6/2006 |
| WO | WO 2009/081378 A1 | 7/2009 |
| WO | WO 2009/153727 A2 | 12/2009 |

OTHER PUBLICATIONS

M.J. Riffe et al., "Power Scavenging Circuit for Wireless DC Power," Proc. Intl. Soc. Mag. Reson. Med. 15 (2007), p. 3273, 2007.
A. Oppelt, "Imaging Systems for Medical Diagnostics," pp. 540-599, 2005.
Chinese Office action for related Chinese Application No. 2012101815941, dated Jul. 20, 2015, with English Translation.

* cited by examiner

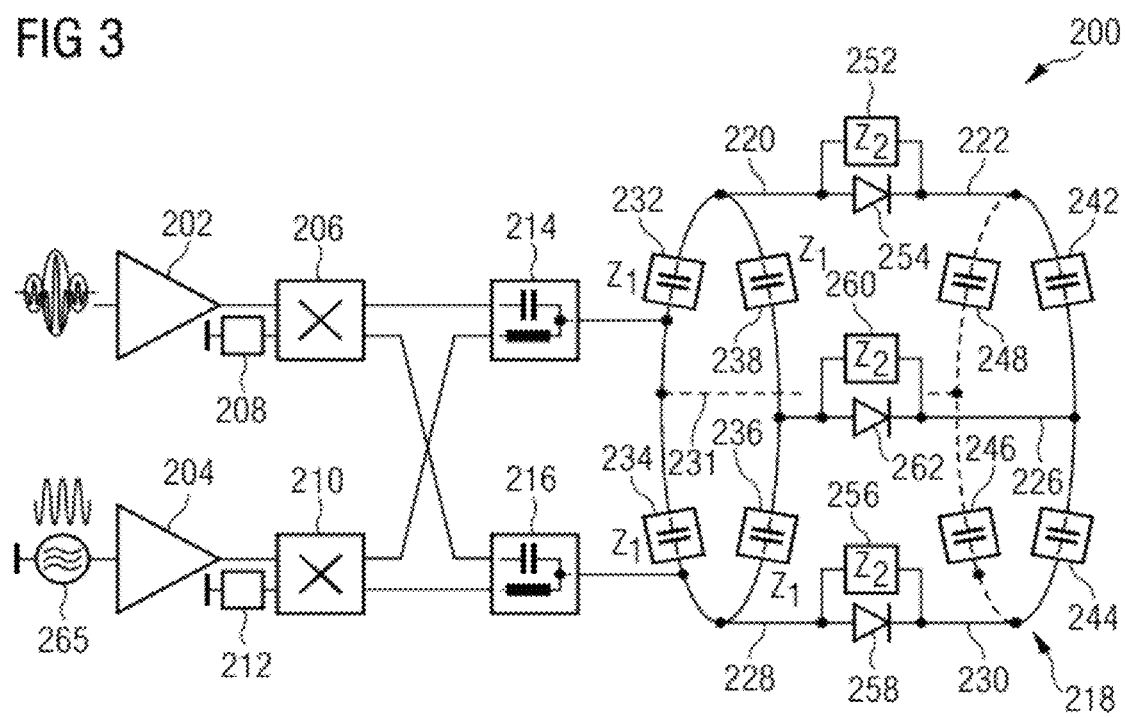

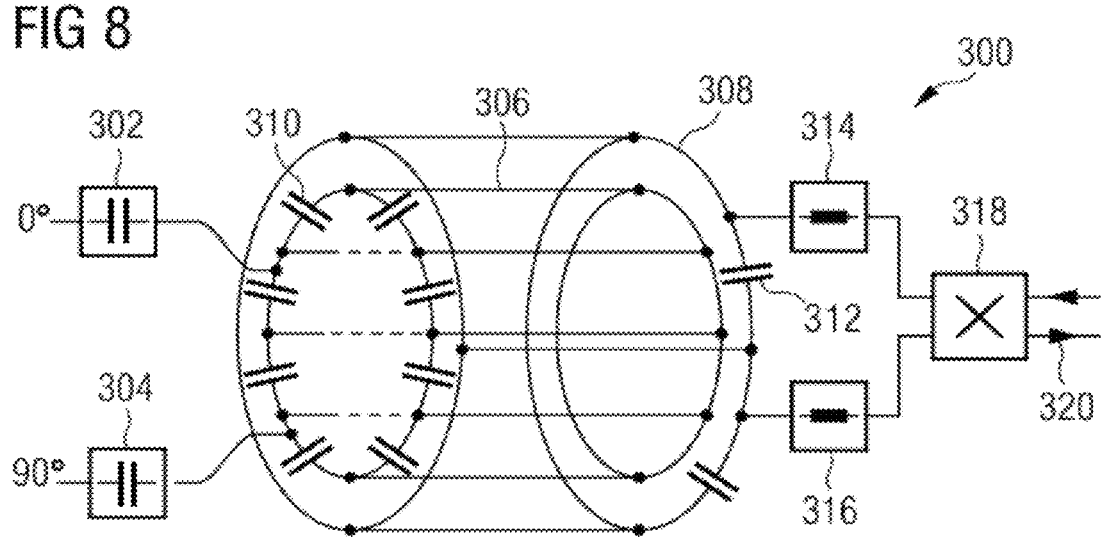
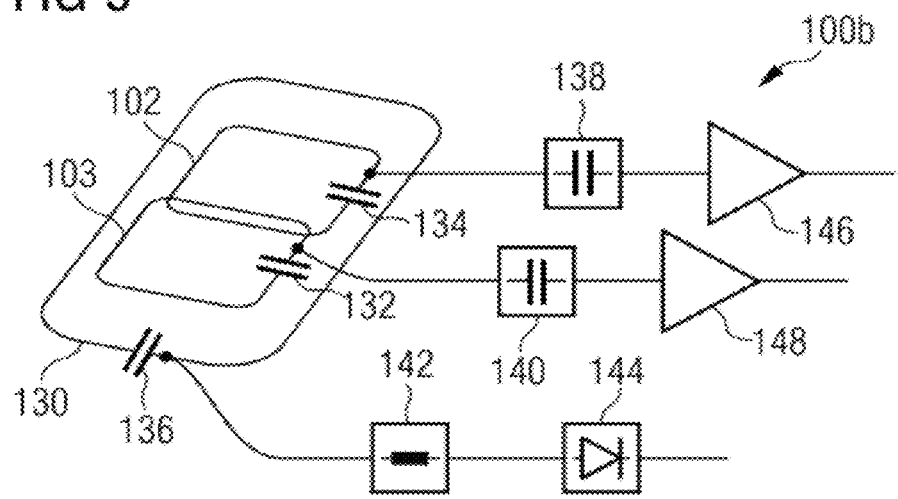

LOCAL COIL SYSTEM, TRANSMITTING DEVICE, MAGNETIC RESONANCE SYSTEM AND METHOD FOR THE WIRELESS TRANSFER OF ENERGY TO A LOCAL COIL SYSTEM

This application claims the benefit of DE 10 2011 076 918.8, filed on Jun. 3, 2011.

BACKGROUND

The present embodiments relate to a local coil system for a magnetic resonance system for capturing MR signals.

A magnetic resonance system includes a tomograph, in which a patient on a couch is positioned in a cylindrical measurement chamber. A strong magnetic field that includes a gradient due to the activation of a number of gradient coils is established in the measurement chamber. The nuclear spin of atoms is aligned by the magnetic field. A transmitting antenna arrangement (e.g., a whole-body transmitting antenna arrangement such as a birdcage antenna) is located in the tomograph for the purpose of emitting the magnetic resonance high-frequency pulses in order to excite the atoms.

With regard to the reception of magnetic resonance signals (MR signals), local coils may be used in the context of a magnetic resonance examination in order to receive the pulses during the relaxation of the nuclear spin. Different materials have different relaxation characteristics, such that conclusions may be drawn in relation to the interior of the patient body on the basis of the relaxation characteristics. The local coils may be combined to form modules (subsequently referred to as "local coil systems") and feature receiving antenna elements in each case (e.g., conductor loops). The received MR signals may be preamplified in the local coil and routed out of the central region of the magnetic resonance installation via cable and supplied to a screened receiver of an MR signal processing device, where the received data is digitized and processed further. In many examinations, a plurality of such local coils is already arranged around the patient in order to cover large regions of the body of the patient.

The functioning of magnetic resonance systems is known and is described in Imaging Systems for Medical Diagnostics, Arnulf Oppelt, Publicis Corporate Publishing, ISBN 3-89578-226-2, for example.

The local coils may be arranged in a local coil blanket that is placed over or under the patient body. Other specially shaped local coil systems such as, for example, head coils may be used. The signals may be carried by cables from the local coil systems to an evaluation device of the magnetic resonance system. The cables are undesirable, since the cables are not easily routed from the patient couch to the evaluation device. The cables are perceived as a nuisance by the staff, and the patient couch (including the patient and the local coil blanket) is mobile. Therefore, the cables are to be routed such that the cables are slack. Therefore, a wireless transfer of the data from the local coil system to the MR signal processing device is desirable. It may be more advantageous to digitize the relevant MR signals already in the local coil system and to transfer the MR signals in digital form.

In the local coil system, energy is used for the purpose of preprocessing the MR signals (e.g., for preamplification, digitization and encoding). Since the aim of the wireless transfer of the data from the local coil system is that a cable connection of the local coil system may be dispensed with completely, the local coil system either includes an adequate energy store, or the energy is also transferred wirelessly to the local coil system.

Microwaves may be used for energy transfer. However, microwave radiation is undesirable, as microwave radiation increases the physiological HF exposure of the patient.

A further option is to divert energy from the magnetic resonance transmission field by attaching a high-frequency rectifier and a buffer (e.g., a capacitor or an accumulator) to an off-resonance circuit of the receiving coils. This has the disadvantage that a current flows at the magnetic resonance frequency when power is diverted into the receiving coils, thereby distorting the field that excites the spins.

SUMMARY AND DESCRIPTION

The present embodiments may obviate one or more of the drawbacks or limitations in the related art. For example, an improved wireless energy supply of a local coil system is provided.

A local coil system according to the present embodiments includes an energy receiving antenna for inductively receiving energy for the local coil system from a temporally varying magnetic field (e.g., an electromagnetic field). The energy receiving antenna is or may be tuned to an energy transfer frequency that is lower than a Larmor frequency of the MR signals to be captured and higher than approximately 20 kHz.

The Larmor frequency is the magnetic resonance working frequency of the magnetic resonance system (e.g., the frequency that is used to excite the nuclear spin and the frequency of the MR signals to be received). The Larmor frequency fL may be calculated in a known manner on the basis of the gyromagnetic ratio γ (e.g., a substance constant) and the magnetic flow density B that is present at the location of the nucleus: fL=γ·B. Given a magnetic flow density of 1.5 T, a Larmor frequency of approximately 63.87 MHz is produced for an atomic nucleus of the type 1H, corresponding to hydrogen. A flow density of 3 T results in a Larmor frequency of approximately 127.74 MHz, for example. Since the magnetic field that is actually present varies locally from a value B0 of a basic magnetic field of the magnetic resonance system, as a result of applying the magnetic field gradient, transmission and reception takes place accordingly in a specific frequency range of e.g. +/−1 MHz either side of the Larmor frequency that is established using the basic magnetic field. A magnetic resonance system may function at a plurality of magnetic resonance working frequencies in order to be capable of exciting different metabolites. In this case, the conditions relating to the energy transfer frequency in the context of the present embodiments apply to all possible Larmor frequencies.

One embodiment of a transmitting device that forms part of a magnetic resonance system and is configured to transmit energy to a local coil system includes an energy transmitting antenna that emits a temporally varying magnetic field having a predefined energy transfer frequency. The transmitting device also includes an oscillator device that is coupled to the energy transmitting antenna and generates an electrical signal for the purpose of activating the energy transmitting antenna. The signal has an energy transfer frequency that is lower than the aforementioned Larmor frequency and higher than approximately 20 kHz.

A magnetic resonance system according to the present embodiments is equipped with the local coil system described above and/or with the transmitting device described above.

In one embodiment of a method for transferring energy to a local coil system using a temporally varying magnetic field, energy is induced in an energy receiving antenna of the local coil system accordingly. The magnetic field varies at an energy transfer frequency that is lower than a Larmor frequency of MR signals to be captured by the local coil system and higher than approximately 20 kHz.

The selection of the energy transfer frequency in the specified frequency range has the advantage that the patient is not exposed to microwave radiation, and the transmission of a temporally varying magnetic field with high power at extremely low frequencies, which may cause other biological effects, is prevented. In this frequency range, the imaging is not disrupted by the energy supply of the local coil system.

In one embodiment, this even allows the reception of MR signals by the local coil system and the transfer of energy to the local coil system to take place simultaneously.

The local coil system of the present embodiments may have a suitable energy store (e.g., a buffer battery), to which, for example, the energy receiving antenna may deliver the received energy. Energy may be taken from the energy store if energy transfer cannot take place at the same time as MR signals are being received, or if the received energy is insufficient. With regard to the receiver active time, good MR sequences may be associated with the MR signal being observed over a large portion of the time (e.g., up to more than 50%). This provides that the average power available to recharge a buffer battery is not to be much less than the operating power of the local coil system. Energy may be supplied irrespective of whether MR signals are currently being received.

The energy store may also be linked to a charging device via a suitable interface in order to charge the energy store when the local coil system is not in use. This interface may also utilize the energy receiving antenna in order to receive wireless energy from the charging device. The local coil system may also have a further interface in the form of a plug connector or similar for the charging device.

Claims of one category may also be developed in a similar manner to the claims of another category.

The energy transfer frequency may be selected such that the energy transfer frequency has no harmonic waves (e.g., multiples) in the Larmor frequency range. The "Larmor frequency range" includes the previously cited frequency band around the Larmor frequency when using the basic magnetic field, in which excitation signals for the atomic nuclei are transmitted, and MR signals are received. No other signals or harmonic waves may be in this range.

The energy transfer frequency may be higher than the bandwidth of the frequency band described above. Since this frequency band may include 1 MHz, the energy transfer frequency may be higher than approximately 1 MHz (e.g., higher than approximately 2 MHz or higher than approximately 4 MHz).

The energy transfer frequency may be lower than approximately 10 MHz (e.g., lower than approximately 6 MHz).

The energy transfer frequency may lie in a range of approximately 4 MHz to approximately 6 MHz.

In order for operation to be possible using an energy transfer frequency in the frequency ranges specified above, the energy receiving antenna of the local coil system may be configured so as to have a resonance range at this energy transfer frequency. The energy transmitting antenna of the transmitting device may be configured so as to be resonant correspondingly in this range, and the oscillator device may have a corresponding working frequency.

The energy receiving antenna may be configured and arranged so as to receive a transverse and circularly polarized magnetic field. In this case, the energy receiving antenna and the local coil(s) may be arranged parallel relative to each other.

Alternatively, the energy receiving antenna may be configured and arranged so as to receive a longitudinal and linearly polarized magnetic field. The direction of polarization may run parallel with the static magnetic field B0. In this case, for example, the energy receiving antenna and the local coil(s) may be arranged orthogonally relative to each other.

The energy receiving antenna may be arranged above at least one local coil. As mentioned previously, the energy receiving antenna may be arranged orthogonally or parallel relative to the local coil, depending on whether a transverse and circularly polarized magnetic field or a longitudinal magnetic field is to be received. A space-saving arrangement of the local coil and the energy receiving antenna may be achieved in this way.

The energy receiving antenna may have a larger contour than at least one local coil, particularly if the energy receiving antenna is arranged above the at least one local coil. The local coil may be arranged within the energy receiving antenna from a plan view.

A plurality of energy receiving antennas may be linked together. The individual energy receiving antennas may be arranged transversely (e.g., orthogonally or at any other desired angle relative to each other). This results in diversity on the receiving side, and the energy supply is provided irrespective of the current position of the local coil blanket containing the local coil system.

According to another embodiment, a local coil is configured so as to be integral with the energy receiving antenna, thereby forming a combination of local coils and energy receiving antennas. For this purpose, the combination of local coils and energy receiving antennas is configured as an antenna having multiple resonances. For example, the combination of local coils and energy receiving antennas may have a tuning circuit that provides that the antenna element (e.g., a single conductor loop, or the antenna elements) features at least two resonance frequency ranges (e.g., one in the range of the Larmor frequency and one in the range of the energy transfer frequency). Such an integrated combination of local coils and energy receiving antennas may be suitable if a transverse and circularly polarized magnetic field is used for the energy transfer.

The combination of local coils and energy receiving antennas may be connected to a filter circuit that is configured to separate the MR signals and the supplied energy. A diplexer or a high-pass circuit and a low-pass circuit may be used for this purpose. If a suitable filter circuit is provided, such a combination of local coils and energy receiving antennas may also be used to receive MR signals and perform an energy transfer simultaneously.

Alternatively or additionally, the tuning circuit may also be configured such that the combination of local coils and energy receiving antennas may be switched between various resonance ranges. The combination of local coils and energy receiving antennas may be tuned to the corresponding MR resonance frequency for the purpose of receiving MR signals, for example. By contrast, tuning to the energy transfer frequency takes place if an energy transfer is to be performed. A simple changeover switch may be used in the local coil system instead of a filter circuit.

Similarly, an energy transmitting antenna of the magnetic resonance system may also be configured so as to be integral with the whole-body coil. This results in a particularly space-saving transmitting antenna for transferring energy to the local coil system. The energy transmitting antenna may be formed around the whole-body coil. In the case of this embodiment likewise, only slightly more space is used in a radial direction within the magnet for the energy transmitting antenna.

The local coil system may include a clock generating device that is attached to the energy receiving antenna. The clock generating device may generate a clock signal for the local coil system from the energy transfer frequency of the magnetic field. The local coil system may therefore be synchronized with the magnetic resonance system (e.g., the clock cycle of the local coil system is synchronized with the clock cycle of the magnetic resonance system).

In one embodiment, a demodulator is attached to the energy receiving antenna. The magnetic field may be modulated in order to simultaneously transfer a signal containing control information or the like to the local coil system via the energy supply, for example. In this case, the demodulator demodulates the resulting signal from the magnetic field that has been modulated by the energy receiving antenna.

BRIEF DESCRIPTION OF THE DRAWINGS

FIG. 3 shows a schematic illustration of one embodiment of an arrangement for transmitting energy to a local coil;

FIG. 8 shows one embodiment of a transmitting arrangement for the wireless transmission of energy to a local coil system;

FIG. 9 shows one embodiment of a receiving arrangement for the wireless reception of energy by a local coil system;

DETAILED DESCRIPTION OF THE DRAWINGS

Figure 1:
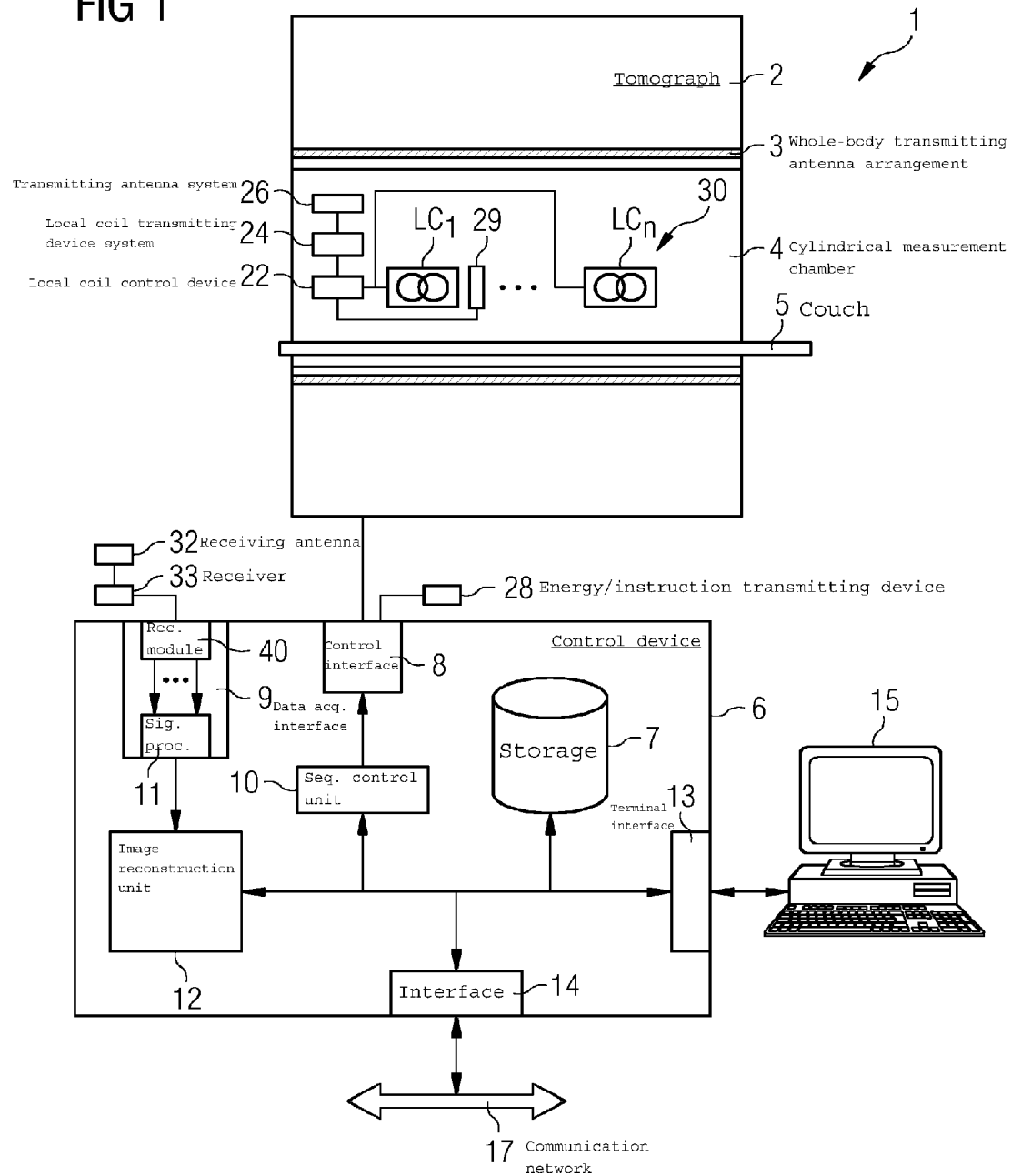
FIG. 1 shows a block diagram of one embodiment of a magnetic resonance system.

FIG. 1 shows a schematic block diagram of a magnetic resonance system 1. The magnetic resonance system 1 includes a conventional tomograph 2 (e.g., a scanner 2), in which a patient (not shown) on a couch 5 is positioned in a cylindrical measurement chamber 4. Inside the tomograph 2 is a whole-body transmitting antenna arrangement 3 (e.g., a birdcage antenna) for transmitting the magnetic resonance high-frequency pulses.

In the exemplary embodiment according to FIG. 1, a magnetic resonance (MR) receiving system 20 includes a local coil system or local coil arrangement 30 (e.g., in the form of a local coil blanket) including a number of local coils LC1, . . . , LCn and a transfer signal receiving module 40. As illustrated in FIG. 1, the local coil arrangement 30 is arranged in the measurement chamber 4 of the tomograph 2 or scanner of the magnetic resonance system 1, while the transfer signal receiving module 40 is located in an associated control device 6 of the magnetic resonance system 1.

An MR signal processing device 11 is also part of the control device 6. The system may be scaled as desired (e.g., any number of physical inputs of the MR signal processing device 11 may be used if the MR receiving system 20 is configured accordingly). One physical input is shown in FIG. 1 for clarity.

The tomograph 2 is activated by the control device 6. A terminal 15 (or operator console) is attached to the control device 6 via a terminal interface 13 and allows an operator to operate the control device 6 and therefore the tomograph 2. The control device 6 is connected to the tomograph 2 via a tomograph control interface 8 and an image acquisition interface 9. Suitable control commands are output to the tomograph 2 by a sequence control unit 10 via the tomograph control interface 8 on the basis of scan protocols in order that the desired pulse sequences (e.g., the high-frequency pulses and the gradient pulses for the gradient coils (not shown) for generating the desired magnetic fields) are transmitted. The image data acquisition interface 9, which forms part of the transfer signal receiving module 40 in FIG. 1, is used to acquire the raw data (e.g., to read out the received MR signals). The control device 6 also features a mass storage 7, in which, for example, generated image data and measurement protocols may be stored.

A further interface 14 is used for the purpose of linking to a communication network 17 that is connected to an image information system (e.g., picture archiving and communication system (PACS)) or offers connection options for external data storage resources, for example.

Both the control device 6 and the terminal 15 may also be integral parts of the tomograph 2. The magnetic resonance system 1 additionally includes all of the other standard components or features, even though these have been omitted from FIG. 1 for the sake of greater clarity.

The local coil arrangement 30 including a number of local coils LC1, . . . , LCn for receiving the magnetic resonance response signals is located in the scanner 2. The local coils are connected via the wireless interface to the transfer signal receiving module 40 of the image acquisition interface 9. The received signals undergo further processing in the MR signal processing device 11 and are supplied to an image reconstruction unit 12 that generates the desired magnetic resonance image data from the received signals in the usual manner. This data may be stored in the storage 7, output at least in part to the operator terminal 15, or sent via the network 17 to other components such as evaluation stations or mass storage.

An energy/instruction transmitting device 28 is also attached to the tomograph control interface 8, for example, and wirelessly transfers energy and instructions or control signals to the local coils LC1, . . . , LCn. For this purpose, the energy/instruction transmitting device 28 may utilize, for example, an energy transmitting antenna that is arranged in the tomograph 2 and described in greater detail below. The local coil arrangement 30 including the local coils LC1, . . . , LCn includes an energy/instruction receiving device 29 that receives the wirelessly transmitted energy and/or the wirelessly transmitted instruction as explained in greater detail below. The energy and the instructions are forwarded to a local coil control device 22, for example. The local coil control device 22 supplies the local coils LC1, . . . , LCn with energy and activates the local coils LC1, . . . , LCn. MR signals that are received from the local coils are passed in prepared format (e.g., digitized format) from a local coil control device 22 to a local coil transmitting device system 24, from where the MR signals are transmitted via a local coil transmitting antenna system 26 to a receiving antenna 32 of a magnetic resonance system 1. The signals received from the receiving antenna 32 are evaluated by a receiver 33 and supplied to the transfer signal receiving module 40.

The MR signals of the local coils LC1, . . . , LCn may be amplified, converted into a digital signal and otherwise undergo further processing for the transfer to a receiver of the magnetic resonance system.

Figure 2:
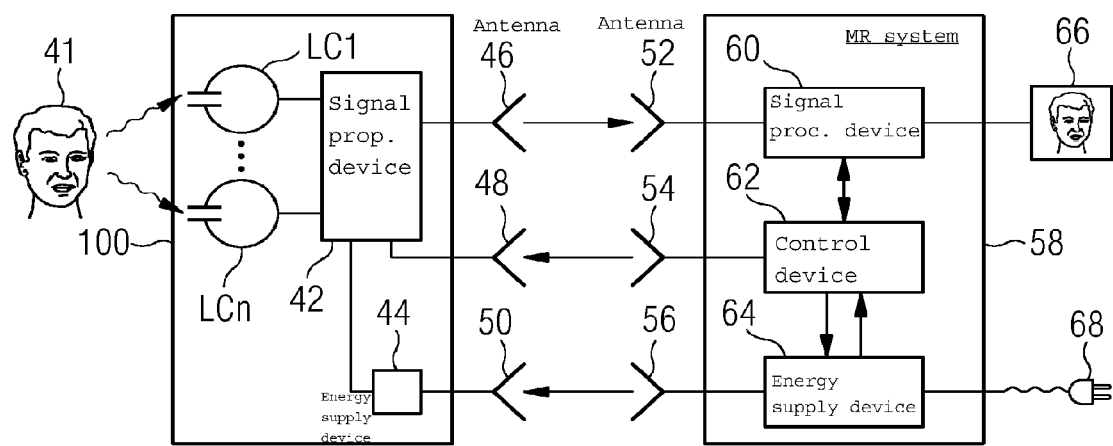
FIG. 2 shows a block diagram of exemplary energy transfer and signal transfer between a magnetic resonance system and a local coil system.

FIG. 2 shows a schematic illustration of the signal flow between a local coil system 100 and further components of the magnetic resonance system 58. A plurality of local coils LC1, . . . , LCn receive MR signals that are emitted from atomic nuclei within a patient 41. The local coils LC1, . . . , LCn are attached to a signal preparation device 42 that prepares the MR signals and emits corresponding transmission signals to the magnetic resonance system 58 via an antenna 46. The signal preparation device 42 receives clocking signals and control instructions via an antenna 48. Energy that is rectified and buffered in an energy supply device 44 on the local coil system side is supplied to the local coil system 100 and, for example, to the signal preparation device 42 via an energy receiving antenna 50.

The magnetic resonance system 58 receives the transmission signals that represent the MR signals using an antenna 52. The transmission signals are processed in a signal processing device 60 (which schematically represents the MR signal processing device and an image reconstruction unit in FIG. 2) and displayed on a screen 66, for example. The signal processing device 60 is linked to a control device 62. The control device 62 transmits clocking signals and instructions to the local coil system 100 via an antenna 54. The control device 62 is linked to an energy supply device 64 that obtains energy via a connection interface 68 and transmits energy to the local coil system via an antenna 56.

FIG. 3 shows a first embodiment of a transmitting device 200 for a magnetic resonance system. The transmitting device 200 is configured to wirelessly transmit energy to a local coil system. A magnetic resonance excitation signal is fed into an MR transmission amplifier 202, where the magnetic resonance excitation signal is amplified by the MR transmission amplifier. The amplified MR excitation signal is fed into a first hybrid device 206. An input of the hybrid device is terminated to ground using a terminating impedance 208. The output signal of the first hybrid device 206 is fed into a first diplexer 214. An output signal of the first hybrid device 206 is fed into a second diplexer 216. Such a diplexer 214, 216 is a multiplexer that connects two inputs to one output. Two transmitting devices may thus be attached to an antenna using a diplexer.

The transmitting device 200 further includes an oscillator 265 that generates a signal that has a frequency of 5 MHz. The signal is fed into an energy amplifier 204 and, after amplification, is fed into a second hybrid device 210, which is terminated at one input by an impedance 212. An output signal of the second hybrid device 210 is fed into the first diplexer 214. A further output signal of the second hybrid device 210 is fed into the second diplexer 216.

The output signal of the first diplexer 214 and the output signal of the second diplexer 216 are fed into a whole-body transmitting antenna arrangement (e.g., a birdcage antenna 218). The birdcage antenna 218 includes a plurality of antenna longitudinal elements 220, 222, 224, 226, 228, 230, 231 that are arranged in a longitudinal direction. The antenna longitudinal elements are connected in a circumferential direction by a plurality of first filters or resonance capacitors 232, 234, 236, 238, 242, 244, 246, 248, Z1 (e.g., two-terminal networks). The birdcage antenna 218 therefore has an essentially cylindrical form.

Two antenna longitudinal elements are connected using a diode 254, 258, 262 in each case. A second filter 252, 256, 260, Z2 or two-terminal network is connected in parallel with each diode.

Using this configuration, both MR excitation signals and a magnetic field for energy transfer may be transmitted simultaneously via the birdcage antenna 218.

Figure 4:
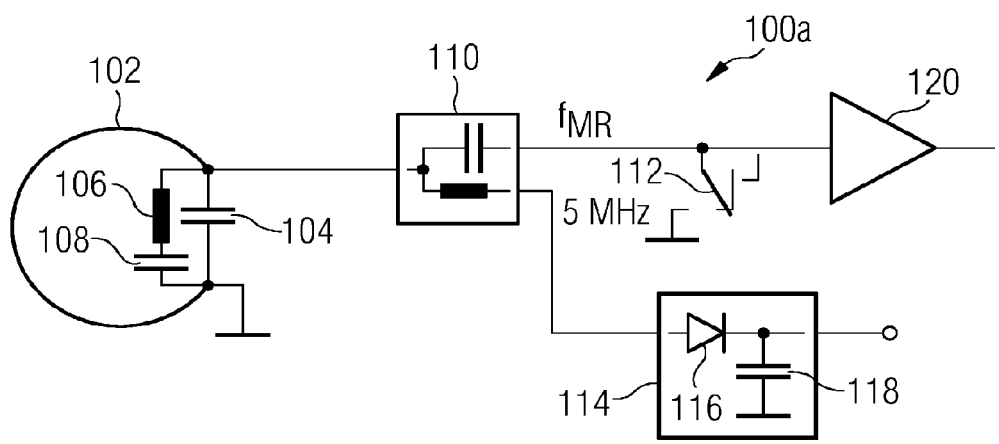
FIG. 4 shows a schematic illustration of one embodiment of an arrangement for the wireless reception of energy by a local coil system.

FIG. 4 shows a first embodiment of a local coil system 100a. The local coil system 100a includes a local coil antenna 102 that is configured so as to provide double resonance. A first capacitor 104 is connected both to a first end of the local coil 102, which is connected to ground, and to a second end of the local coil 102, which forms the output of the local coil. A series circuit including a coil 106 and a second capacitor 108 is connected in parallel with the first capacitor 104.

The output of the local coil antenna 102 is connected to a third diplexer 110. One output of the third diplexer 110 is connected to an off-resonance setting switch 112 and a preamplifier 120. The one output outputs the MR signal for the imaging. A rectifier 116 is attached to the other output of the third diplexer 110. The other output outputs the energy supply signal (e.g., at a frequency of 5 MHz). The rectifier includes a diode 116 that is connected between the input and the output of the rectifier 114. Connected to the output of the diode 116 is a third capacitor 118 that is also connected to ground.

The magnetic field for the energy transfer is to be configured such that the power is available at any location (relative to the patient) where a local coil may receive MR signals. Both the transmitting antennas and the receiving antennas may be dedicated antennas or coils for the energy supply. In the embodiment according to FIGS. 3 and 4, however, the whole-body transmitting antenna arrangement (e.g., the birdcage antenna 218) and the local coil 102 (e.g., the receiving antenna) are modified so that the whole-body transmitting antenna arrangement and the local coil 102 have a second resonance (e.g., 5 MHz). In the example according to FIGS. 3 and 4, the energy transfer frequency is 5 MHz. However, the energy transfer frequency may be in a range of approximately 1 MHz to approximately 10 MHz. Energy transfer frequencies of approximately 2.5 MHz or approximately 5 MHz may also be used. The energy transfer frequency may correspond approximately to the MR basic clock cycle or to a whole-number part or whole-number multiple of the MR basic clock cycle.

Using the example described above, a transverse, as far as possible homogeneous, and circularly polarized field may be generated in the birdcage antenna 218. The field has essentially the same field structure as an MR transmission field. This field may be received by the local coils 102, which are sensitive to radial field components if the local coils 102 support a second resonance frequency by virtue of a modified configuration.

This extension of the birdcage antenna 218 may be effected by additional series resonant circuits at each first filter 232, 234, 236, 238, 242, 244, 246, 248, Z1. If PIN diodes are connected between the antenna longitudinal elements 220, 222, 224, 226, 228, 230, 231 for the off-resonance setting of the MR transmitting antenna for the magnetic resonance reception, second filters 252, 256, 260, Z2 may be connected in parallel with the diodes 254, 258, 262 in order to avoid any undesired through-connection of the diodes as a result of the voltage of the energy supply. The diodes are disabled during reception of the magnetic resonance signals by the local coils by a negative D.C. voltage of, for example, −40 V in order to prevent part of the received MR signal being taken from the receiving local coils due to magnetic coupling. Any unwanted influence on the resonance condition that is set for the energy supply frequency may be avoided by disabled diodes.

The circularly polarized HF magnetic field that is transmitted by the birdcage antenna 218 for the purpose of excitation is to rotate in a direction that depends on the orientation of the static basic field in order to excite the nuclear spin of the atoms. The magnetic field for transferring the energy may rotate in the opposite direction to that of the magnetic field for exciting the nuclear spin. Both fields may rotate in the same direction.

Figure 5:
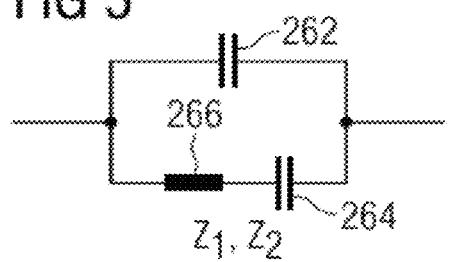
FIG. 5 shows one embodiment of a tuning circuit for the dual-resonant configuration of an antenna.

FIG. 5 shows a circuit diagram of the first two-terminal network 232, 234, 236, 238, 242, 244, 246, 248, Z1 and of the second two-terminal network 252, 256, 260, Z2. A first capacitor 262 is connected between the input and the output of the first filter and the second filter, respectively. A series circuit including a second capacitor 264 and a coil 266 is connected in parallel with the first capacitor 262. This results in a double-resonance configuration of the antenna elements of the birdcage antenna shown in FIG. 3.

Figure 6:
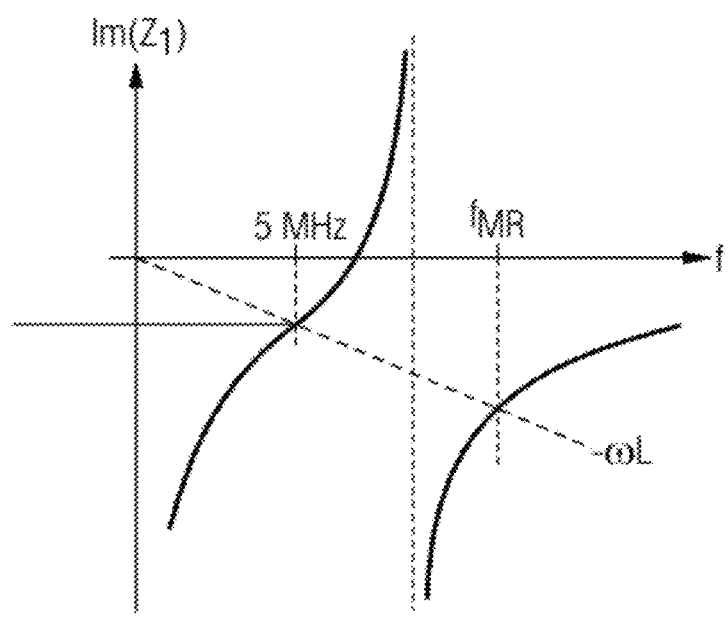
FIG. 6 shows an exemplary impedance frequency response of a resonance capacitor.

FIG. 6 shows the impedance frequency response of the first filter 232, 234, 236, 238, 242, 244, 246, 248, Z1.

Figure 7:
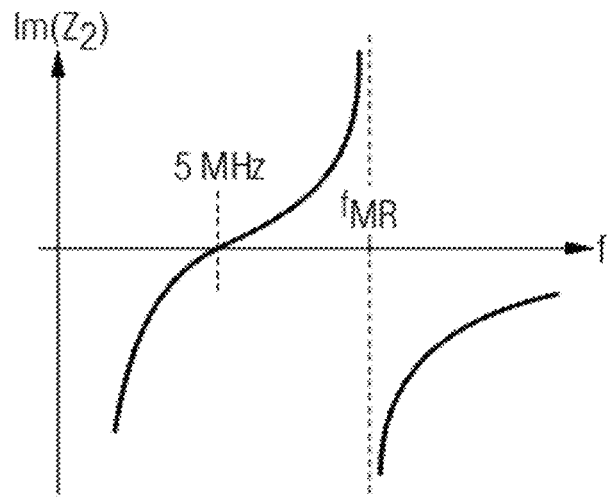
FIG. 7 shows an exemplary impedance frequency response of a filter.

FIG. 7 shows the frequency response of the second filter 252, 256, 260, Z2.

Possible combinations of capacities and inductivities in the circuits shown in FIGS. 3 and 5, or in FIG. 4, are specified below by way of example for an MR frequency of 63.6 MHz and an energy transfer frequency of 5.0 MHz.

In the exemplary embodiment according to FIG. 3 including a whole-body coil 200 having an impedance of, for example, 50 nH, if a two-terminal network Z1 is implemented, as per FIG. 5, a capacitor 262 of 132 pF, a coil 266 of 1 µH and a capacitor 264 of 965 pF may, for example, be used to achieve the total-impedance of the two-terminal network Z1, as shown in FIG. 6.

In order to achieve the total-impedance, as per FIG. 7, of the two-terminal network Z2 in the case of the exemplary embodiment according to FIG. 3, a capacitor 262 of 3.3 pF, a coil 266 of 2 µH and a capacitor 264 of 506 pF may, for example, be used in the implementation according to FIG. 5.

In the exemplary embodiment according to FIG. 4 including a local coil 102 having an impedance of, for example, 125 nH, a capacitor 104 of 44 pF, a coil 106 of 2 µH and a capacitor 108 of 477 pF may, for example, be used, and the diplexer 110 may be configured at 10 pF and 10 µH, for example.

As an alternative to the configuration shown in FIG. 3, the birdcage antenna may be embodied by the configuration of the diodes so that the resonance frequency of the birdcage antenna may be switched over. For example, the resonance frequency may correspond to the Larmor frequency (e.g., 63.6 MHz) during transmission of the MR excitation signal, while the resonance frequency of the birdcage antenna may correspond to the energy supply frequency (e.g., 5 MHz) during reception of the received MR signals by the local coils. This procedure has the disadvantage that the energy supply is interrupted during the transmission of the MR excitation signal. The voltage that is generated by the signal of the energy supply (e.g., the oscillating signal of 5 MHz) is not to become too high at the deactivated PIN diodes.

Alternatively, two separate birdcage transmitting antennas may be arranged concentrically, one inside the other. FIG. 8 shows an embodiment, in which a whole-body transmitting antenna arrangement in the form of a birdcage antenna 306 for transmitting MR excitation signals is arranged inside an energy transmitting antenna 308. The two antennas may share use of the field reflection space that is important for efficiency, such that hardly any additional radial space is used in the magnet of the tomograph.

Two high passes 302, 304 feed the MR excitation signal into the whole-body transmitting antenna arrangement 306 (e.g., the conventional birdcage antenna), where antenna longitudinal elements are linked to capacitors 310. An energy supply signal at the energy transfer frequency is fed into a hybrid device 318, which is terminated by an impedance 320. The outputs of the hybrid device are linked to the energy transmitting antenna 308 via two low passes 314, 316. The antenna longitudinal elements of the energy transmitting antenna 308, which is also configured as a birdcage antenna, are linked to capacitors 312. Since the demands with respect to field homogeneity of the energy transmitting antenna 308 are more modest, fewer antenna longitudinal elements are used, for example, than in the case of the birdcage antenna 306 for transmitting the MR excitation signals.

Since the whole-body transmitting antenna arrangement 306 and the energy transmitting antenna 308 are still magnetically coupled, filtering may be provided despite separate connection interfaces.

This antenna arrangement likewise generates transverse and circularly polarized magnetic fields for energy transfer.

FIG. 9 shows a second embodiment of a local coil system 100b. A first local coil 102 and a second local coil 103 (e.g., local coils) are arranged next to each other. The local coils 102, 103 each feature a capacitor 132, 134 for tuning to the Larmor frequency. Each of the local coils 102, 103 is connected to a high pass 138, 140 that is connected to an amplifier 146, 148. The amplifiers output amplified MR signals. An energy receiving antenna 130 is situated above the local coils 102, 103. The energy receiving antenna 130 may have a contour such that at least two local coils 102, 103 lie within the energy receiving antenna 130 from a plan view. The energy receiving antenna 130 includes a capacitor 136, to which a low pass 142 and a rectifier 144 are attached.

Figure 10:
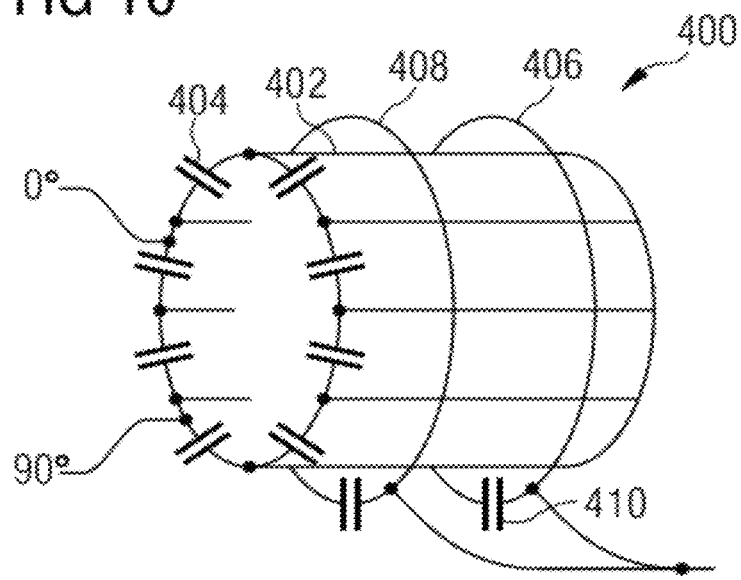
FIG. 10 shows one embodiment of a transmitting arrangement for the wireless transmission of energy to a local coil system.
Figure 11:
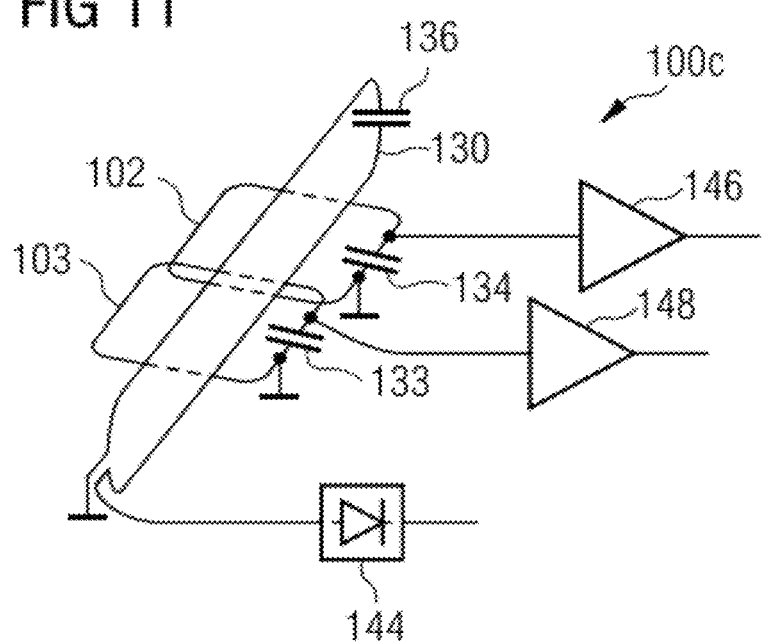
FIG. 11 shows one embodiment of a receiving arrangement for the wireless reception of energy by a local coil system.

A longitudinal and linearly polarized field that runs parallel with the static magnetic field B0 (e.g., in a longitudinal direction of the tomograph) may be used for the energy transfer. Reference is made to FIGS. 10 and 11 in relation to this. A centrally arranged toroidal coil or a Helmholtz pair 406, 408 may be provided for generating the magnetic field for the energy transfer. An additional energy receiving antenna 130 is provided on the receiver side, and may be arranged orthogonally relative to the local coils 102 and 103. This embodiment has the advantage that the respective antennas are geometrically separate from each other, and therefore, the additional filters that are provided in the second embodiment may be omitted.

FIG. 10 shows a birdcage antenna 404 for transmitting MR excitation signals. A Helmholtz pair 406, 408 for generating the longitudinal and linearly polarized magnetic field is arranged around the birdcage antenna 404. Each antenna of the Helmholtz pair includes a capacitor 410.

FIG. 11 correspondingly shows a third embodiment of a local coil system 100c. Two local coils 102, 103 each include a capacitor 133, 134. Each of the local coils is connected to a receiver 146, 148. An energy receiving antenna 130 including a capacitor 136 is arranged orthogonally relative to the local coils 102, 103 and above the local coils. The energy receiving antenna 130 is connected to a rectifier 144.

Each local coil system may include a single local coil and a single energy receiving antenna. A simpler and more modular structure, in which no connections are required between the individual local coils, may thus be provided. In order to reduce the overheads associated with the reception of the supply energy, an energy receiving antenna may supply a plurality of local coils.

Figure 12:
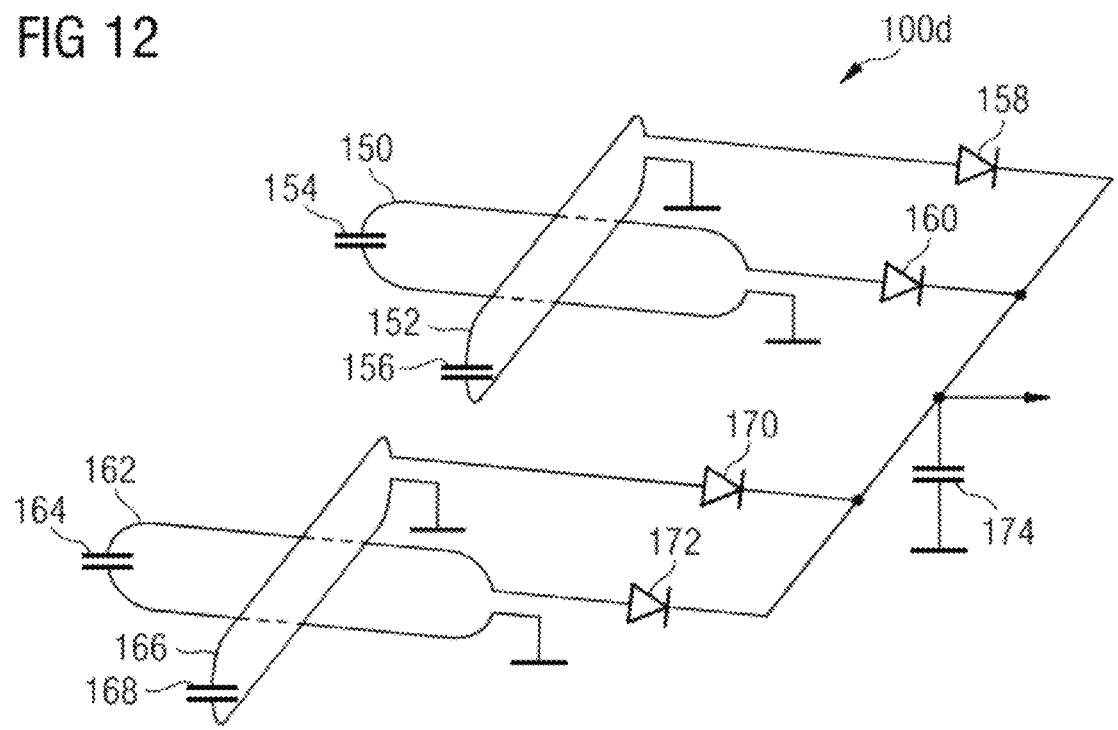
FIG. 12 shows one embodiment of a receiving arrangement for the wireless reception of energy by a local coil system.

FIG. 12 shows a fourth embodiment of a local coil system 100d. A plurality of energy receiving antennas 150, 152, 162, 166 are provided. The energy receiving antennas or energy receiving coils are arranged so as to be perpendicular relative to each other in some cases. The energy receiving antennas may be arranged next to each other and/or one above the other in this type of configuration. The sensitivity of the local coil system 100d relative to a non-optimal orientation of the energy receiving antennas is thereby reduced. A rectifier element 158, 160, 170, 172 may be arranged at each of the energy receiving antennas 150, 152, 162, 166. The outputs of the rectifier elements are linked to each other and to a capacitor.

Due to an energy transfer frequency that is low in comparison with the MR transmission frequencies, the ratio of power that is absorbed in the patient (e.g., the specific absorption rate (SAR)) to power that may be drawn is optimized. Since the permissible SAR exposure for a patient (e.g., 4 W/kg) may already be largely utilized by the MR transmission pulses, the smallest possible additional amount may be assigned for the energy supply of the local coil system (e.g., 0.04 W/kg).

Figure 13:
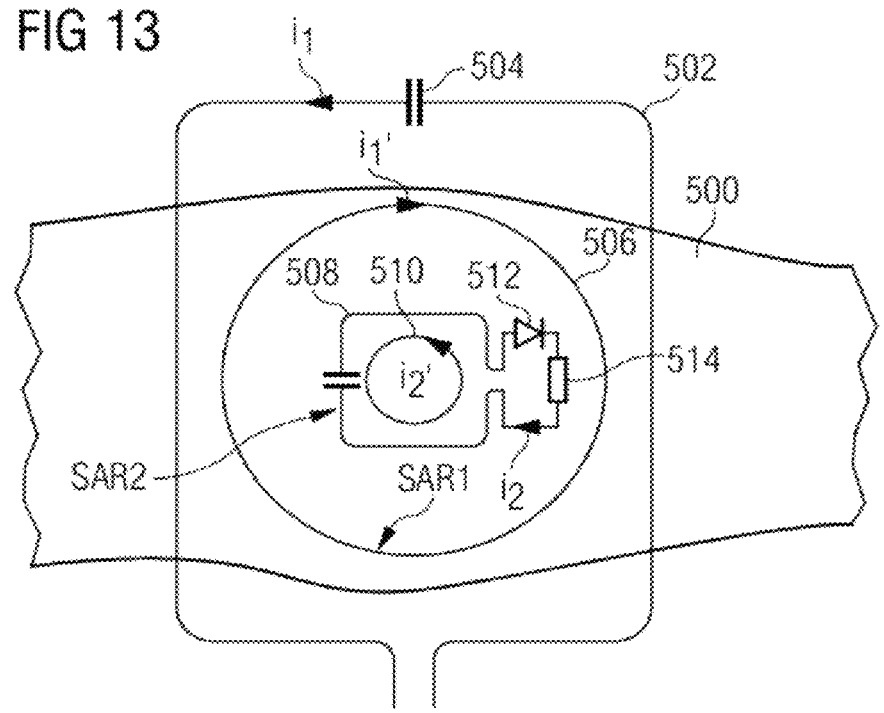
FIG. 13 shows a schematic plan view of one embodiment of an arrangement for the wireless transfer of energy to a local coil system and the eddy currents that occur.

Reference is made to FIG. 13 in relation to this. Two contributing factors to the power absorbed in the patient may occur during the inductive transfer of energy. The homogeneous energy transmission field, which is generated by the energy transmitting antenna 502 and the capacitor 504, may cause a general warming of a patient 500 due to an eddy current $i_1'$ in an eddy current loop 506. The eddy current $i_1'$ is dependent on the square of the product of transmission field strength and frequency. For a given absorption area, however, the available induction voltage is also proportional to this product. For a predefined global SAR value, only a specific output voltage may be provided irrespective of the frequency.

When a current i2 is taken from an energy receiving antenna 508 of a local coil system in the vicinity of the patient 500, the energy receiving antenna 508 is surrounded by secondary HF magnetic fields that result in additional eddy currents $i_2'$ in an eddy current loop 510 under the energy receiving antenna 508. The local SAR contribution depends on the square of the product of current and frequency. This provides that, for a given permissible SAR value, the available load current and hence the available power increases in proportion to the decrease in the frequency that is selected.

Since the primary and the secondary magnetic field exhibit a phase shift of approximately 90° as a result of an ohmic load, the SAR contributions may be added arithmetically. An optimal load resistance, at which the two SAR contributions are approximately equal, may be derived. This load resistance may be significantly higher than an internal resistance of the energy receiving antenna, which is determined by the resonance quality. Operation as a lightly loaded voltage source may be provided. Operation that is adapted to the power may be avoided. A resonant short circuit may also be avoided, since this may result in a superproportional rise in the SAR exposure due to the secondary HF magnetic field. For example, a safety fuse may be used to prevent any potential risk from such an error. As a result of the relatively high-resistance load 512, 514, a plurality of energy receiving antennas 508 may be operated alongside each other without significant reciprocal influence.

In order to provide the lowest possible absorption of power (e.g., SAR contribution) by the patient, the lowest possible energy transfer frequency may be used. A higher field strength and a higher transmission coil current i1 is to be provided for a specified induction voltage. The efficiency of the energy transmitting antenna is lower at a lower energy transfer frequency. Consequently, a higher power is provided for the energy transmitting antenna. The power is converted into dissipated heat. These conditions of compatibility are fully satisfied by the ranges that are specified above for the energy transfer frequencies.

Figure 14:
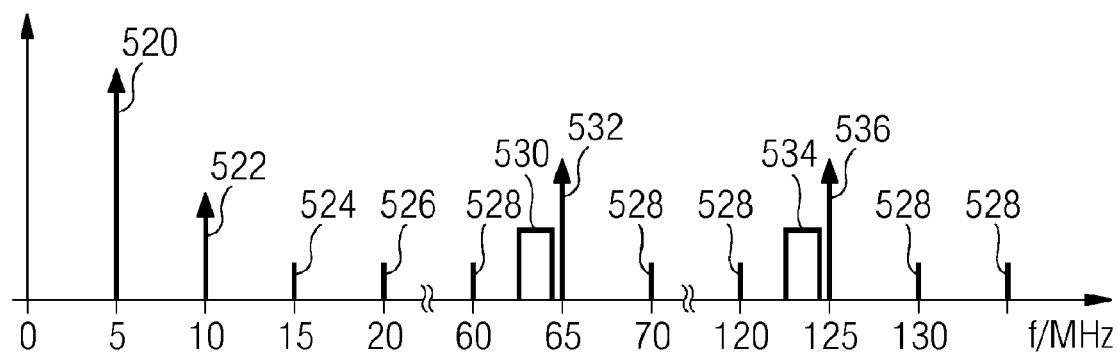
FIG. 14 shows a schematic illustration of an exemplary spectrum of signals that are used.

A suitable choice of frequency is discussed with reference to FIG. 14, which schematically shows the spectral distribution. The field strength (in arbitrary units) is plotted over the frequency f (in MHz). The frequencies and spectra shown in FIG. 13 are generated by the following components:

520: Energy transfer frequency
522: Clock cycle of the analog/digital converter
524, 526, 528: Multiples of the energy transfer frequency
530: Larmor frequency band, where B0=1.5 T
532: Local oscillator for B0=1.5 T
534: Larmor frequency band where B0=3 T
536: Local oscillator for B0=3 T As shown in FIG. 14, the energy transfer frequency may therefore be selected such that no multiples or harmonics of the energy transfer frequency fall into the MR receiving frequency band. For example, harmonic waves that are produced during the rectification may be prevented from disrupting the MR reception. Therefore, the band from approximately 63.2 MHz to approximately 74 MHz may remain interference-free.

In order to prevent any internal interference, the sampling frequency of the analog/digital converter and all frequencies of the oscillators used for the frequency conversion may be whole-number multiples of a basic system frequency (e.g., 2.5 MHz), which multiples likewise should not fall into one of the MR reception bands.

The energy supply frequency may also be used as a reference frequency for the receivers and the digitization. The required frequencies of the oscillators may be derived from the energy transfer frequency using a frequency multiplier or a PLL circuit.

Due to movements of the patient, slight detuning of the resonance of the receiving antennas may occur, possibly resulting in a detrimental phase change in the received reference frequency and hence in the received signals. This effect is advantageously minimized by the high load resistance that is desirable due to the SAR, since the effective degraded quality of the resonant circuit is significantly reduced, and the bandwidth is increased thereby.

Additional information such as the configuration of the receiving channels and the radio frequencies, for example, may be transferred to the local coil system during pauses in reception by modulating the energy supply frequency.

Figure 15:
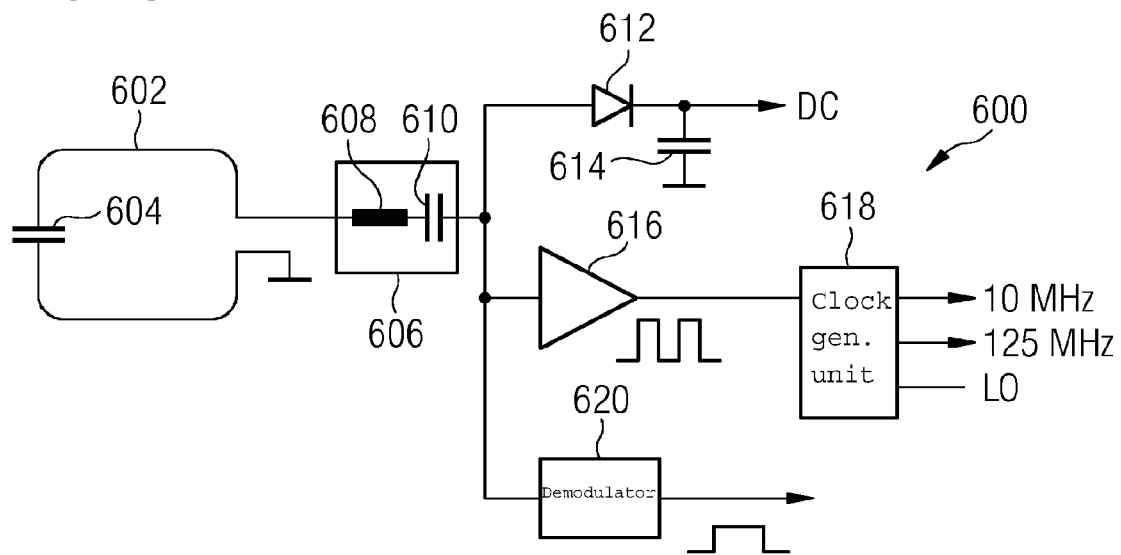
FIG. 15 shows one embodiment of an arrangement for the reception of energy by a local coil system.

Accordingly, a fifth embodiment of a local coil system 600, as illustrated in FIG. 15, includes an energy receiving antenna 602 that includes a capacitor and is connected to a band-pass filter 608. A rectifier element 612 including a capacitor is connected to the band-pass filter 608 in order to generate the energy supply current. Also attached to the band-pass filter is an amplifier 616 that passes the energy supply frequency to a clock generating unit 618 that may generate at least one oscillating signal. Also attached to the band-pass filter 608 is a demodulator 620 that generates control data from the modulated energy supply frequency data.

According to the present embodiments, the inductive energy transfer takes place at a frequency that is comparatively low relative to the MR frequency. A homogeneous transfer is effected by circularly polarized and transverse or longitudinal magnetic fields. Multi-resonance transmitting and receiving antennas may be provided for the energy transfer. Compared with the internal resistance of the energy receiving antenna, a high load impedance may be connected to the energy receiving antenna. A plurality of energy receiving antennas may be attached to one or more rectifiers for redundant diversity reception. In order to prevent interference from the energy transfer frequency, the energy transfer frequency is set at multiples of the system basic clock. In addition, the energy transfer may be used at the same time to provide clock cycle signals and control signals.

The above described methods and configurations relate to exemplary embodiments, and the fundamental principle may be varied in broad areas by the person skilled in the art without departing from the scope of the invention, as specified in the claims. The use of the indefinite article "a" or "an" does not preclude the possibility of multiple instances of the features concerned. Likewise, the term "unit" does not preclude the possibility that this may consist of a plurality of components that may also be physically distributed if applicable.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil system for a magnetic resonance system for capturing magnetic resonance (MR) signals, the local coil system comprising:
   a local coil comprising at least one antenna for MR signal reception, wherein the MR signals are captured at a Larmor frequency;
   at least one separate local coil comprising an energy receiving antenna for inductively receiving energy for the local coil system from a temporally varying magnetic field; and
   a buffer battery configured to store at least a portion of the received energy,
   wherein the energy receiving antenna is tuned to an energy transfer frequency that is lower than the Larmor frequency of the captured MR signals and higher than 20 kHz, and
   wherein the energy transfer frequency corresponds to a MR basic clock cycle or to a whole-number part or whole-number multiple of the MR basic clock cycle.

2. The local coil system as claimed in claim 1, wherein the energy transfer frequency is selected such that the energy transfer frequency has no harmonic waves in the range of the Larmor frequency, the energy transfer frequency is higher than 1 MHz, or a combination thereof.

3. The local coil system as claimed in claim 2, wherein the energy receiving antenna is configured to receive a transverse and circularly polarized magnetic field.

4. The local coil system as claimed in claim 2, wherein the energy receiving antenna is configured to receive a longitudinal and linearly polarized magnetic field that runs in a field direction of a basic magnetic field of the magnetic resonance system.

5. The local coil system as claimed in claim 1, wherein the energy receiving antenna is configured to receive a transverse and circularly polarized magnetic field.

6. The local coil system as claimed in claim 1, wherein the energy receiving antenna is configured to receive a longitudinal and linearly polarized magnetic field that runs in a field direction of a basic magnetic field of the magnetic resonance system.

7. The local coil system as claimed in claim 1, wherein the energy receiving antenna is arranged above at least one local coil of the local coil system.

8. The local coil system as claimed in claim 1, wherein the energy receiving antenna has a larger contour than at least one local coil of the local coil system, and
   wherein the at least one local coil is arranged within the energy receiving antenna from a plan view.

9. The local coil system as claimed in one of the claim 1, further comprising a plurality of interlinked energy receiving antennas, the plurality of interlinked energy receiving antennas comprising the energy receiving antenna.

10. The local coil system as claimed in claim 9, further comprising:
   at least one local coil, the at least one local coil combined with an energy receiving antenna to provide a combination of local coils and energy receiving antennas.

11. The local coil system as claimed in claim 10, wherein the combination of the local coils and the energy receiving antennas is connected to a filter circuit that is configured to separate the MR signals and the energy.

12. The local coil system as claimed in claim 10, wherein the combination of the local coils and the energy receiving antennas comprises a tuning circuit for tuning the combination of the local coils and the energy receiving antennas to at least two resonance frequencies.

13. The local coil system as claimed in claim 1, further comprising a clock generating device connected to the energy receiving antenna,
   wherein the clock generating device is operable to generate a clocking signal for the local coil system from the energy transfer frequency of the temporally varying magnetic field.

14. The local coil system as claimed in claim 1, further comprising a demodulator connected to the energy receiving antenna,
   wherein the demodulator is operable to demodulate a signal resulting from a modulated magnetic field.

15. A magnetic resonance system comprising:
a local coil system for capturing magnetic resonance (MR) signals at a Larmor frequency and inductively receiving energy at a separate frequency, the local coil system comprising:
- a plurality of local coils, wherein one local coil of the plurality of local coils is integral with an energy receiving antenna for inductively receiving energy for the local coil system from a temporally varying magnetic field,
- a buffer battery configured to store at least a portion of the received energy, wherein the energy receiving antenna is tuned to an energy transfer frequency that is lower than the Larmor frequency of the captured MR signals and higher than 20 kHz, and
wherein the energy transfer frequency corresponds to a MR basic clock cycle or to a whole-number part or whole-number multiple of the MR basic clock cycle.

16. The magnetic resonance system as claimed in claim 15, further comprising:
a transmitting device configured to transmit energy to the local coil system, the transmitting device comprising:
an energy transmitting antenna that emits the temporally varying magnetic field at a predefined energy transfer frequency; and
an oscillator device that is linked to the energy transmitting antenna and is operable to generate a signal for activating the energy transmitting antenna,
wherein the signal has an energy transfer frequency that is lower than the Larmor frequency of the captured MR signals and higher than 20 kHz.

17. A method for transferring energy to a local coil system of a magnetic resonance system, the method comprising:
inducing energy in an energy receiving antenna of the local coil system by temporally varying magnetic fields; and
storing at least a portion of the induced energy in a buffer battery,
wherein the local coil system captures MR signals at a Larmor frequency,
wherein the magnetic field temporally varies at a frequency that is lower than the Larmor frequency of the captured MR signals and higher than 20 kHz, and
wherein the frequency corresponds to a MR basic clock cycle or to a whole-number part or whole-number multiple of the MR basic clock cycle.

18. The method as claimed in claim 17, wherein a reception of the MR signals by the local coil system and a transfer of the energy to the local coil system take place simultaneously.

* * * * *